(12) United States Patent
Dede

(10) Patent No.: US 8,203,839 B2
(45) Date of Patent: Jun. 19, 2012

(54) COOLING DEVICES, POWER MODULES, AND VEHICLES INCORPORATING THE SAME

(75) Inventor: Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 69 days.

(21) Appl. No.: 12/721,174

(22) Filed: Mar. 10, 2010

(65) Prior Publication Data
US 2011/0222239 A1 Sep. 15, 2011

(51) Int. Cl.
*H05K 7/20* (2006.01)

(52) U.S. Cl. .......... 361/692; 361/677; 361/679.46; 361/689; 361/702

(58) Field of Classification Search .......... 361/676–678, 361/679.46, 688–694, 699, 701–702
See application file for complete search history.

(56) References Cited

U.S. PATENT DOCUMENTS

| | | | |
|---|---|---|---|
| 4,420,739 A * | 12/1983 | Herren | 338/53 |
| 5,212,627 A | 5/1993 | No | |
| 5,719,444 A * | 2/1998 | Tilton et al. | 257/714 |
| 6,313,991 B1 | 11/2001 | Nagashima et al. | |
| 6,404,628 B1 | 6/2002 | Nagashima et al. | |
| 6,452,798 B1 | 9/2002 | Smith et al. | |
| 6,952,347 B2 | 10/2005 | Baeumel et al. | |
| 7,200,007 B2 * | 4/2007 | Yasui et al. | 361/716 |
| 7,231,960 B2 * | 6/2007 | Sakai | 165/76 |
| 7,311,140 B2 | 12/2007 | McCullough | |
| 7,508,668 B2 | 3/2009 | Harada et al. | |
| 7,886,811 B2 * | 2/2011 | Higashiyama | 165/173 |
| 2001/0033477 A1 * | 10/2001 | Inoue et al. | 361/718 |
| 2002/0001177 A1 | 1/2002 | Petibon | |
| 2003/0152819 A1 * | 8/2003 | Hatoh et al. | 429/32 |
| 2004/0197633 A1 * | 10/2004 | Yamamoto et al. | 429/34 |
| 2005/0103486 A1 * | 5/2005 | Demuth et al. | 165/174 |
| 2006/0243422 A1 * | 11/2006 | Sakai et al. | 165/80.4 |
| 2006/0284308 A1 * | 12/2006 | Harada et al. | 257/729 |
| 2008/0156462 A1 * | 7/2008 | Arik et al. | 165/80.4 |
| 2008/0310104 A1 * | 12/2008 | Campbell et al. | 361/690 |
| 2009/0251859 A1 | 10/2009 | Harada et al. | |

OTHER PUBLICATIONS

J. Ogando, "Thermally conductive plastics beat the heat," Design News, Sep. 2001, Last accessed Sep. 28, 2009 <http://www.design-news.com/article/165-Thermally_conductive_plastics_beat_the_heat.php>.
CYTEC Industries, "Thermally conductive graphite fibers from BP Amoco," CYTEC Bulletin CF-F-50124, Last accessed Sep. 25, 2009 <http://www.cytec.com/engineered-materials/downloads/Thermalbrochure.pdf>.
Cool Polymers, Inc., "CoolPoly E5101 Thermally Conductive Polyphenylene Sulfide (PPS)", Last accessed Sep. 28, 2009 <http://www.coolpolymers.com/files/ds/Datasheet_e5101.pdf>.
Cool Polymers, Inc., "CoolPoly D5506 thermally conductive liquid crystalline polymer (LCP)", Last accessed Sep. 25, 2009 <http://www.coolpolymers.com/files/ds/Datasheet_d5506.pdf>.

* cited by examiner

*Primary Examiner* — Courtney Smith
(74) *Attorney, Agent, or Firm* — Dinsmore & Shohl LLP

(57) ABSTRACT

A cooling device may include a fluid inlet manifold, a case body, and a fluid outlet manifold that are formed of a molded polymer composite material. The fluid inlet manifold may include a fluid inlet channel and a fluid inlet reservoir. The case body may include a plurality of cooling channels extending from a first surface of the case body to a second surface of the case body. The cooling channels may fluidly couple the first surface of the case body to the fluid inlet reservoir. The fluid outlet manifold may further include a fluid outlet channel and a fluid outlet reservoir. The cooling channels may fluidly couple the second surface of the case body to the fluid outlet reservoir. The fluid inlet channel, cooling channels, and fluid outlet channels may include a cross-section topology.

13 Claims, 7 Drawing Sheets

COOLING DEVICES, POWER MODULES, AND VEHICLES INCORPORATING THE SAME

TECHNICAL FIELD

The present specification generally relates to apparatuses for cooling heat generating devices and, more specifically, to cooling devices having a plurality of channels for routing cooling fluid to remove heat generated by a semiconductor device.

BACKGROUND

Heat sinking devices may be coupled to a heat generating device such as a semiconductor device to remove heat and lower the maximum operating temperature of the heat generating device. Cooling fluid may be used to receive heat generated by the heat generating device by convective thermal transfer and remove such heat from the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Accordingly, a need exists for alternative cooling devices for cooling heat generating devices.

SUMMARY

In one embodiment, a cooling device may include a fluid inlet manifold, a case body, and a fluid outlet manifold. The fluid inlet manifold may be formed of a molded polymer composite material and include a fluid inlet channel fluidly coupled to a fluid inlet reservoir. The case body may be formed of the molded polymer composite material and include a plurality of cooling channels extending from a first surface of the case body to a second surface of the case body. The cooling channels may fluidly couple the first surface of the case body to the fluid inlet reservoir of the fluid inlet manifold. The fluid outlet manifold may be formed of the molded polymer composite material and include a fluid outlet channel fluidly coupled to a fluid outlet reservoir. The fluid outlet reservoir is fluidly coupled to the plurality of cooling channels of the case body.

In another embodiment, a power module may include a semiconductor device, a fluid inlet manifold, a case body, and a fluid outlet manifold. The fluid inlet manifold may include a fluid inlet channel fluidly coupled to a fluid inlet reservoir. The case body may include a plurality of cooling channels extending from a first surface of the case body to a second surface of the case body and the semiconductor device has a first side, a second side, a third side and a fourth side. The semiconductor device is embedded within the case body, and the cooling channels fluidly couple the first surface of the case body to the fluid inlet reservoir of the fluid inlet manifold. The fluid outlet manifold may include a fluid outlet channel fluidly coupled to a fluid outlet reservoir. The fluid outlet reservoir is fluidly coupled to the plurality of cooling channels of the case body, and the fluid inlet channel, the fluid inlet reservoir, the cooling channels, the fluid outlet reservoir and the fluid outlet channel may enable a flow of a cooling fluid adjacent to the first, second, third and fourth sides of the semiconductor device.

In yet another embodiment, a vehicle includes a power module electrically coupled to a vehicle electrical system. The power module further includes a fluid inlet manifold, a case body, and a fluid outlet manifold. The fluid inlet manifold may be formed of a molded polymer composite material and include a fluid inlet channel fluidly coupled to a fluid inlet reservoir. The case body may be formed of the molded polymer composite material and include a plurality of cooling channels extending from a first surface of the case body to a second surface of the case body, and a semiconductor device comprising one or more electrical contacts, a first side, a second side, a third side and a fourth side. The semiconductor device may be embedded in the case body. The one or more electrical contacts of the semiconductor device are electrically coupled to the vehicle electrical system, and the cooling channels may fluidly couple the first surface of the case body to the fluid inlet reservoir of the fluid inlet manifold. The fluid outlet manifold may be formed of the molded polymer composite material and include a fluid outlet channel fluidly coupled to a fluid outlet reservoir. The fluid outlet reservoir may be fluidly coupled to the plurality of cooling channels of the case body, and the fluid inlet channel, the fluid inlet reservoir, the cooling channels, the fluid outlet reservoir and the fluid outlet channel may enable a flow of a cooling fluid adjacent the first, second, third and fourth sides of the semiconductor device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

FIG. 1 generally depicts one embodiment of a power module comprising a cooling device and two heat generating devices. The cooling device generally comprises a fluid inlet manifold, a case body, and a fluid outlet manifold molded from a thermally conductive polymer. The fluid inlet manifold may have one or more fluid inlet channels and a fluid inlet reservoir. The case body has a plurality of cooling channels. The fluid outlet manifold may comprise one or more fluid outlet channels and a fluid outlet reservoir. The heat generating devices may be power electronic devices such as semiconductor devices, for example, and may be molded into the case body. The fluid inlet and outlet reservoirs and cooling channels direct a flow of cooling fluid adjacent to a plurality of sides of the heat generating devices to remove the heat radiating therefrom. Various embodiments of the cooling devices and power modules and the operation thereof will be described in more detail herein.

Figure 1A:
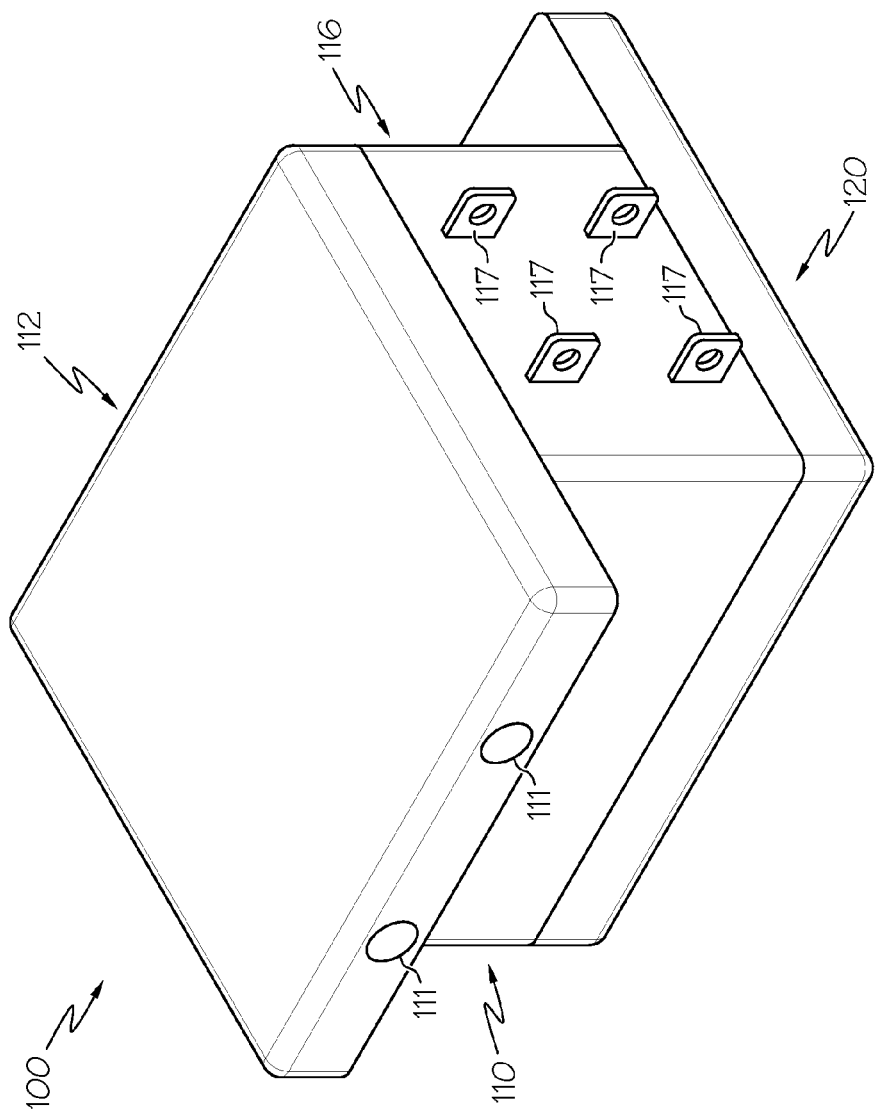
FIG. 1A depicts a perspective view of a power module according to one or more embodiments shown and described herein.
Figure 1B:
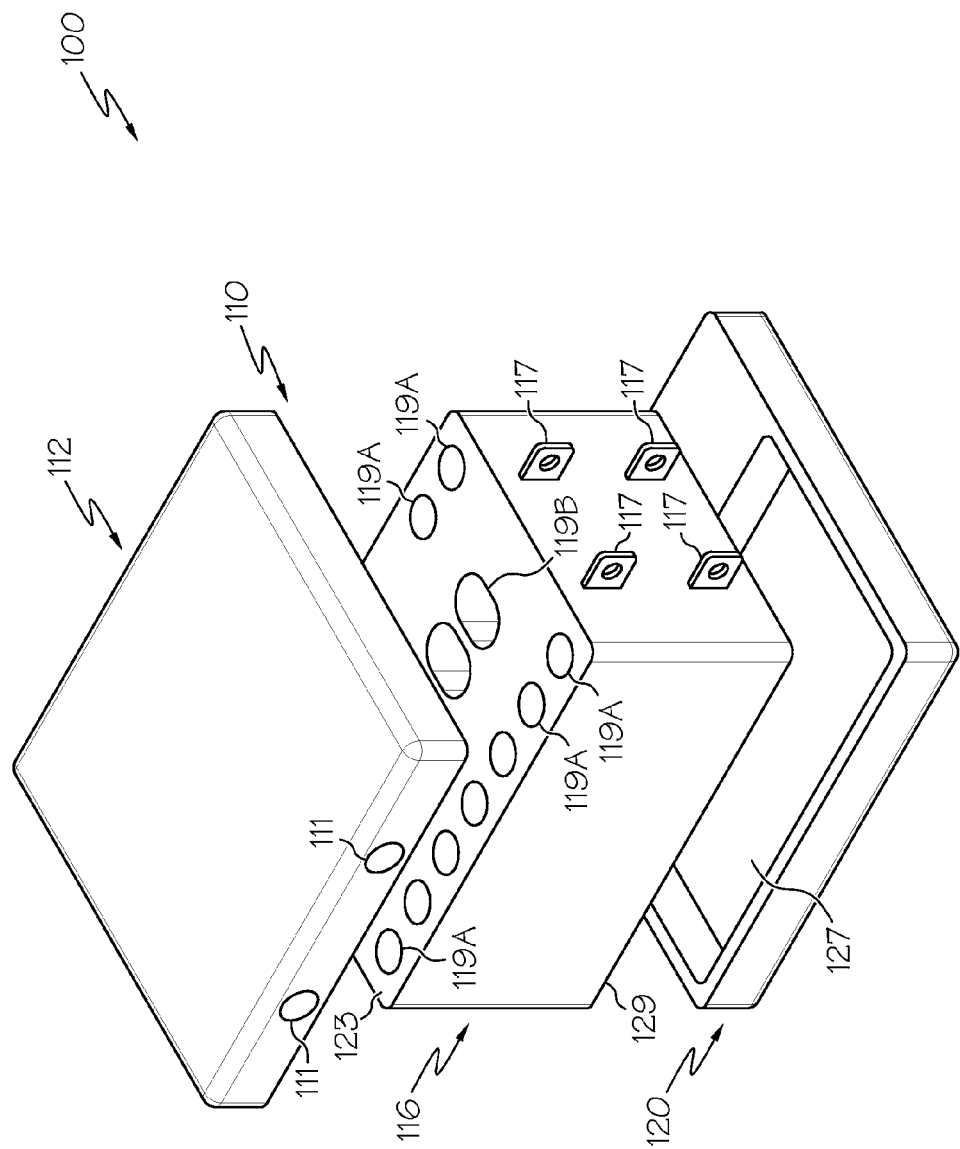
FIG. 1B depicts an exploded perspective view of a power module according to one or more embodiments shown and described herein.
Figure 1C:
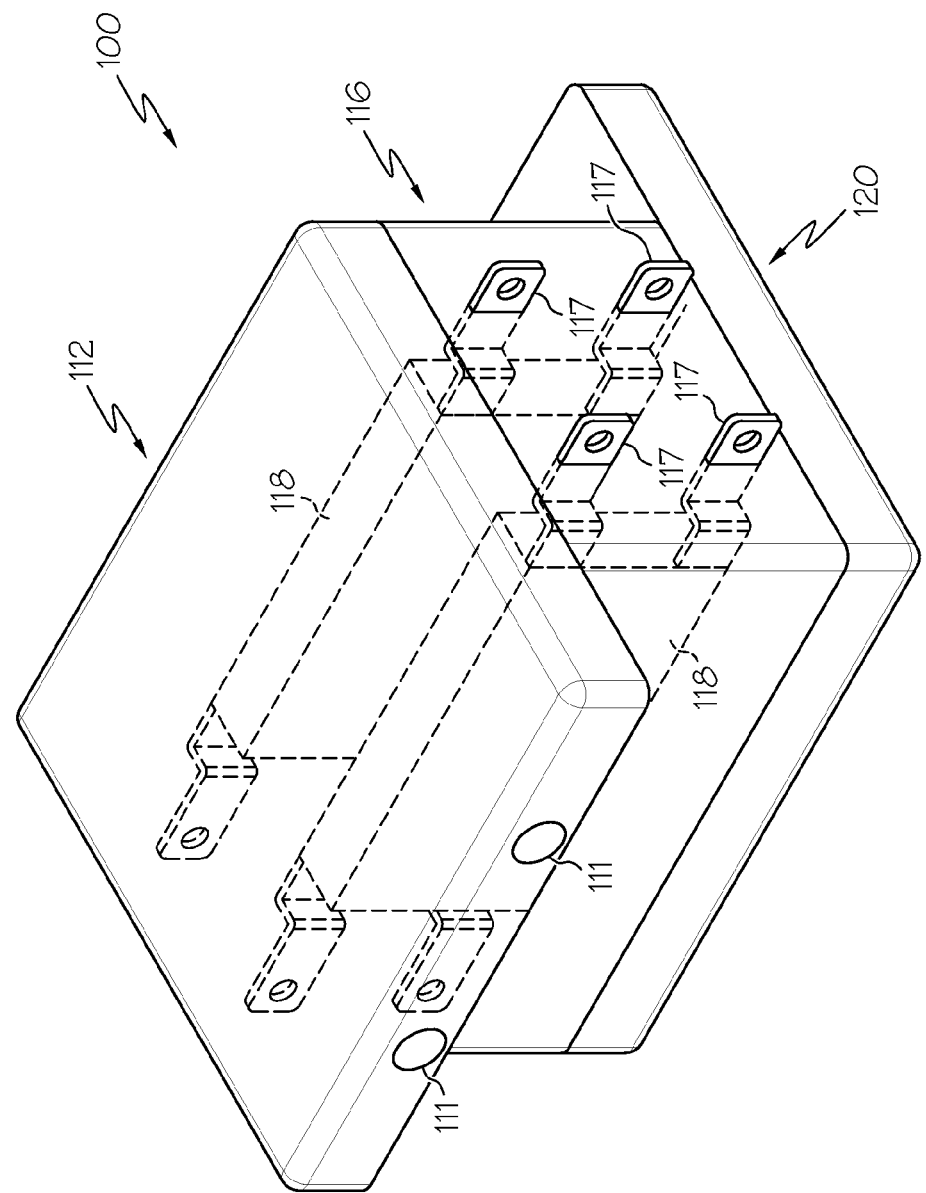
FIG. 1C depicts a perspective view of a power module with interior semiconductor devices illustrated by dashed lines according to one or more embodiments shown and described herein.
Figure 1D:
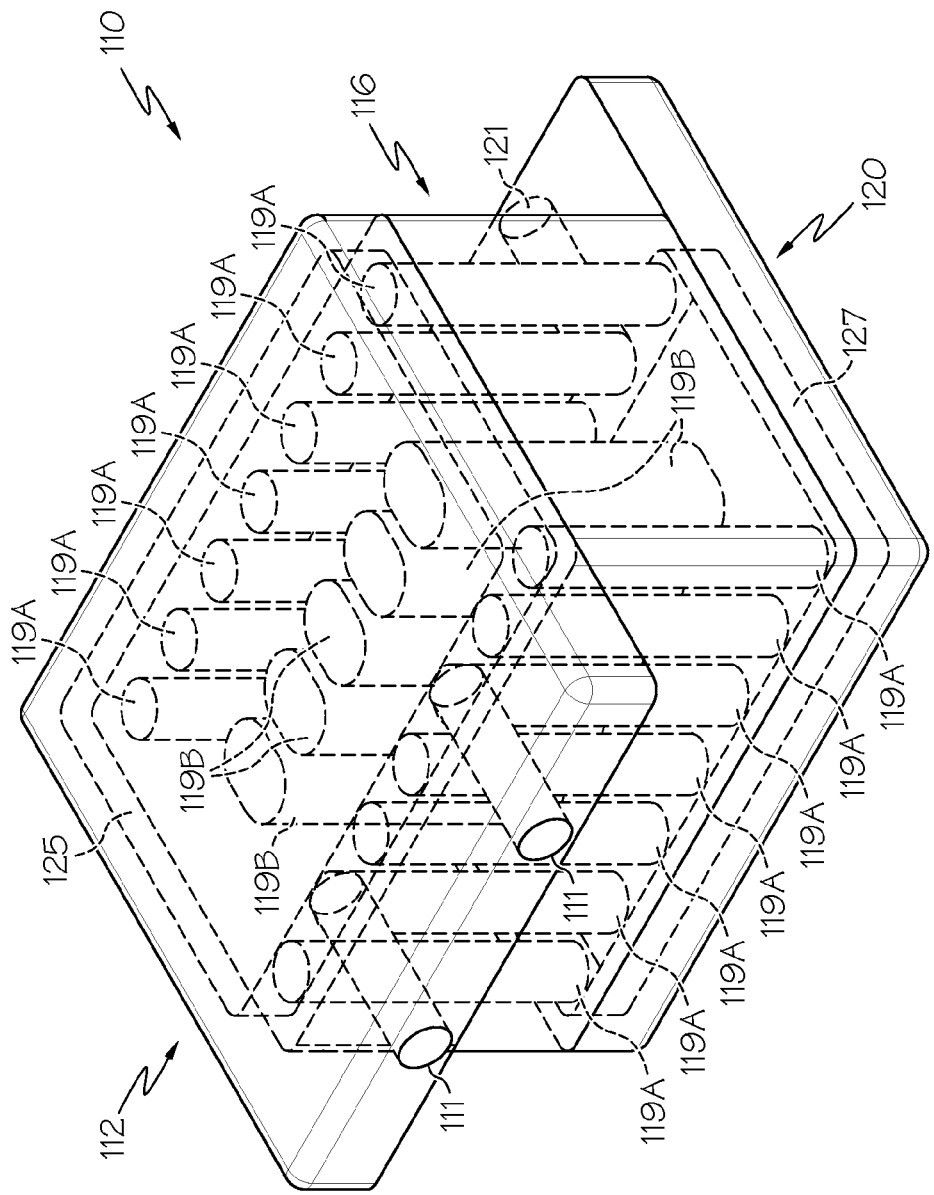
FIG. 1D depicts a perspective view of a cooling device with interior cooling channels and fluid inlet and outlet reservoirs illustrated by dashed lines according to one or more embodiments shown and described herein.

Referring now to FIGS. 1A-1C, one embodiment of a power module 100 and an associated cooling device 110 is illustrated. As used herein, the term power module generally denotes a cooling device having one or more heat generating devices 118 embedded therein. The term cooling device generally denotes the related components of the cooling device without the heat generating device or devices. For ease of illustration, FIG. 1C illustrates the embedded heat generating devices 118 with dashed lines without illustrating interior channels and reservoirs (described in detail below), while FIG. 1D illustrates interior channels and reservoirs with dashed lines without illustrating the embedded heat generating devices 118.

The cooling device 110 of the power module 100 generally comprises a fluid inlet manifold 112, a case body 116, and a fluid outlet manifold 120. The power module 100 of the illustrated embodiment comprises two semiconductor devices 118 (FIG. 1C) embedded within the case body 116 of the cooling device 110. The semiconductor devices 118 may be power semiconductor modules that may include, without limitation, IGBTs, RC-IGBTs, MOSFETs, power MOSFETs, diodes, transistors, and/or combinations thereof (e.g., power cards). The semiconductor devices 118 may have a plurality of electrical contacts 117 that extend from an exterior surface or surfaces of the case body 116. The semiconductor devices 118 of the illustrated power module 100 may be embedded within a thermally conductive material such that the entire package (i.e., the cooling device 110 package) acts as a heat sink to remove heat generated by the semiconductor device 118. FIG. 1C illustrates the two semiconductor devices 118 embedded within the case body 116. As shown in FIG. 1C, each side of the embedded semiconductor devices 118 is surrounded by the thermally conductive material of the case body. It should be understood that any number of semiconductor devices 118 (or other heat generating devices) may be embedded within the case body 116 depending on the particular application for which the power module 100 is designed. Therefore, the size and shape of the case body 116 and corresponding fluid inlet and outlet manifolds 112, 120 may vary.

The fluid inlet manifold 112, case body 116, and fluid outlet manifold 120 may be molded from a thermally conductive dielectric plastic composite material such as a polymer matrix having a distribution of thermally conductive particulate filler material (e.g., thermally conductive micro-scale or nano-scale ceramic or graphite particles) for enhanced conductive heat transfer throughout the cooling device 110. The polymer composite material acts as an electrical insulator to prevent the semiconductor devices 118 from shorting. The filler material of thermally conductive micro-scale or nano-scale particles may increase the thermal conductivity of the cooling device 110. Exemplary polymer matrix materials may include, but are not limited to, thermally conductive liquid crystalline polymers (e.g., D-series liquid crystalline polymers manufactured by Cool Polymers® of Warwick, R.I.), thermally conductive polyphenylene sulfide (e.g., E-series polyphenylene sulfide manufactured by Cool Polymers® of Warwick, R.I.), and thermally conductive polypropylene (e.g., D-series polypropylene polymers manufactured by Cool Polymers® of Warwick, R.I.). It should be understood that other similar thermally conductive, dielectric polymers may be used for the fluid inlet manifold 112, case body 116, and fluid outlet manifold 120.

The semiconductor devices 118 may be embedded into the case body 116 during a molding process in which the thermally conductive dielectric plastic composite material is over-molded onto the semiconductor devices 118, thereby surrounding the semiconductor devices 118 such that the electrical contacts 117 extend from the case body 116 upon completion of the molding process. Similarly, the fluid inlet manifold 112 and the fluid outlet manifold 120 may also be fabricated by molding processes. The fluid inlet manifold 112, case body 116, and fluid outlet manifold 120 may be separately fabricated in different molding processes. The fluid inlet manifold 112, case body 116 and fluid outlet manifold 120 may then be coupled together to form a cooling device 110 using an adhesive or mechanical coupling methods. Depending on the shape and configuration of the cooling device 110, some or all of the fluid inlet manifold 112, case body 116 or fluid outlet manifold 120 may be molded together in a single molding process.

Referring specifically to FIG. 1D and generally to FIGS. 1A and 1B, the fluid inlet manifold 112, case body 116, and fluid outlet manifold 120 comprise channels and reservoirs operable to receive and direct cooling fluid throughout the cooling device 110 and power module 100. The illustrated fluid inlet manifold 112 comprises two integral fluid inlet channels 111 and a fluid inlet reservoir 125. However, it should be understood that the embodiments described herein are not limited to two fluid inlet channels and that any number of such fluid inlet channels may be utilized. The fluid inlet channels 111 and fluid inlet reservoir 125 may be formed by using an appropriate mold during the molding process, for example. The fluid inlet channels 111 can be coupled to a cooling fluid source (not shown) to enable the flow of cooling fluid through the fluid inlet channels 111 and into the fluid inlet reservoir 125.

The case body 116 comprises a plurality of cooling channels (e.g., two rows of outer cooling channels 119A and one row of inner cooling channels 119B as shown in FIGS. 1B and 1D). The illustrated outer and inner channels 119A, 119B extend in a direction that is substantially normal to the plane defined by the fluid inlet reservoir 125. However, it should be understood that the outer and inner channels 119A, 119B may have other orientations or comprise curves or other departures from linearity within the case body 116. The semiconductor devices 118 may be positioned between the outer channels 119A and the inner channels 119B. In a power module 100 having more than two semiconductor devices (or heat generating devices), additional rows of inner and outer cooling channels may be provided.

The cooling channels 119A, 119B extend from a first surface 123 of the case body 116 that is coupled to the fluid inlet manifold 112 to a second surface 129 of the case body 116 that is coupled to the fluid outlet manifold 120. As described above with reference to the fluid inlet manifold 112, the inner and outer cooling channels 119A, 119B may be formed during the molding process. The cooling channels 119A, 119B fluidly couple the case body 116 to the fluid inlet manifold 112 at the fluid inlet reservoir 125. As described in more detail below, cooling fluid may enter the cooling device 110 at the fluid inlet channels 111, flow through the fluid inlet channels 111 to the fluid inlet reservoir 125, and then flow into the cooling channels 119A, 119B of the case body 116.

In the illustrated embodiment, the inner cooling channels 119B are oval in cross-section and are relatively larger than the outer cooling channels 119A to provide adequate cooling fluid adjacent to the inner sides of the two semiconductor devices 118. The outer channels 119A may be relatively smaller than the inner cooling channels 119B because such channels are adjacent to only one side of the semiconductor devices 118. In another embodiment, the inner and outer cooling channels may be similar in shape and size.

The illustrated fluid outlet manifold 120 comprises two integral fluid outlet channels 121 and a fluid outlet reservoir 127. It should be understood that the embodiments described herein are not limited to two fluid outlet channels and that any number of such fluid inlet channels may be provided. The fluid outlet channels 121 and the fluid outlet reservoir 127 may be formed during the molding process. The fluid outlet channels 121 can be coupled to a cooling fluid removal line (not shown) to enable the heated cooling fluid to exit the power module 100 and cooling device 110. The cooling fluid may be re-chilled in a cooling process and recycled into the fluid inlet channels 111 of the fluid inlet manifold 112.

The cooling channels 119A, 119B fluidly couple the case body 116 to the fluid outlet manifold 120 at the fluid outlet reservoir 127. As described in more detail below, cooling fluid may flow from the cooling channels 119A, 119B into the fluid outlet reservoir 127 and exit the power module 100 and cooling device 110 via the fluid outlet channels 121.

Figure 1E:
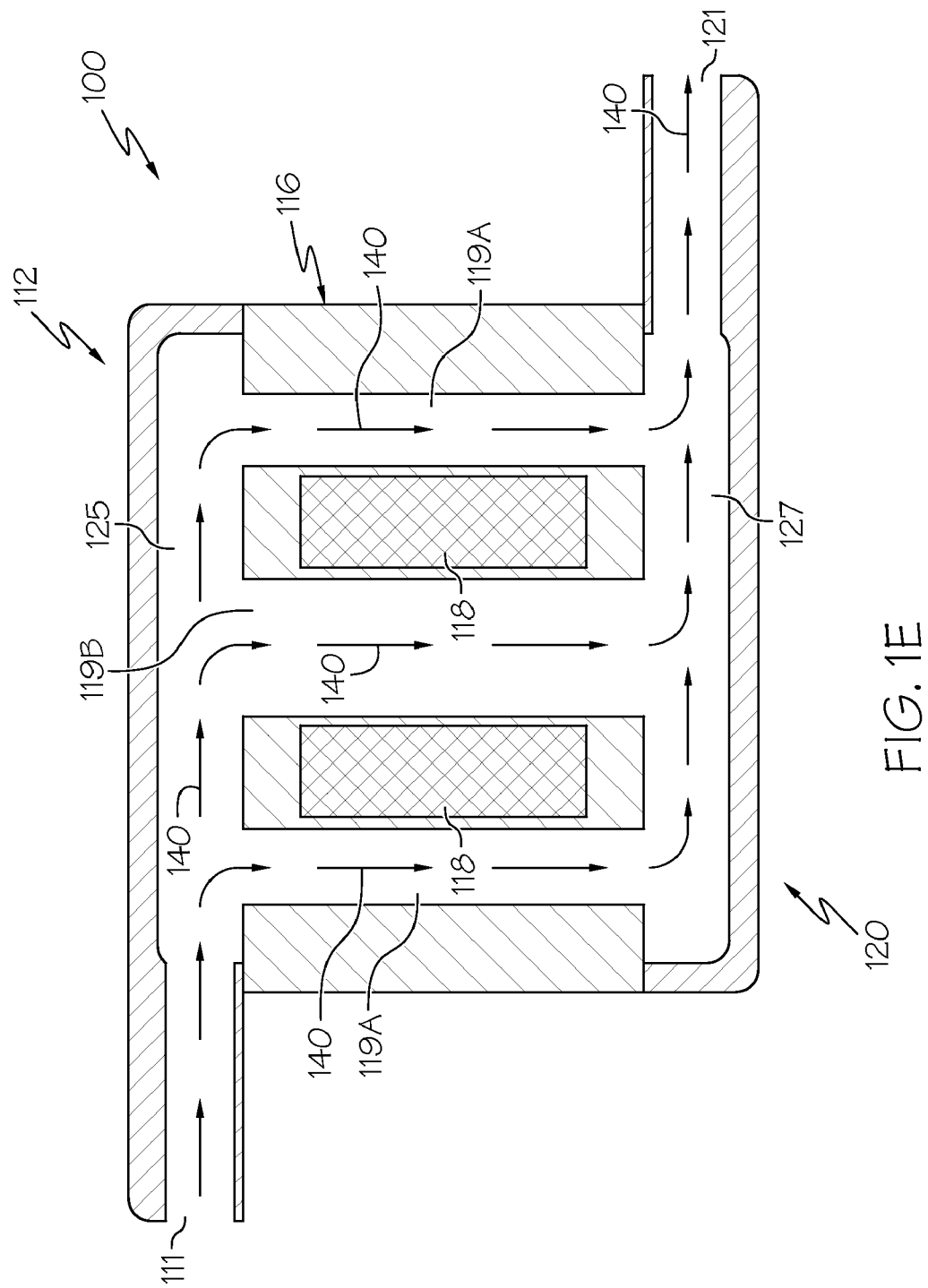
FIG. 1E depicts a cross-sectional view of a power module with cooling fluid paths illustrated by arrows according to one or more embodiments shown and described herein.

Referring to FIGS. 1C-1E, the fluid inlet manifold 125, cooling channels 119A, 119B, and fluid outlet manifold 127 are positioned around the embedded semiconductor devices 118 such that each side of the semiconductor devices 118 is adjacent to a flow of cooling fluid. When the power module 100 is oriented with the fluid inlet manifold 112 as an upper surface, the fluid inlet reservoir 125 provides cooling fluid flow proximate an upper surface of the semiconductor devices 118, the cooling channels 119A, 119B of the case body 116 provides cooling fluid flow proximate two vertical sides of the semiconductor devices 118, and the fluid outlet reservoir provides cooling fluid flow proximate a bottom surface of the semiconductor devices 118.

Referring specifically to FIG. 1E, the cooling fluid flow within one embodiment of a power module 100 and associated cooling device 110 will now be described. The cooling fluid (i.e., a cooling fluid flow path illustrated by arrows 140) may be provided from a cooling fluid reservoir (not shown) that maintains chilled cooling fluid. Cooling fluid may be water, refrigerant, or other suitable cooling fluids such as radiator fluid, for example. In one embodiment, the power module 100 may be coupled to an electrical system of a vehicle and the cooling fluid reservoir may be a radiator reservoir.

The cooling fluid reservoir may be coupled to the fluid inlet manifold 112 via a fluid line and associated mechanical coupling devices (not shown). The cooling fluid may enter the fluid inlet manifold 112 through the one or more fluid inlet channels 111 and flow into the fluid inlet reservoir 125. Once in the fluid inlet reservoir 125, the cooling fluid 140 may uniformly flow into the outer cooling channels 119A and inner cooling channels 119B. As illustrated in FIG. 1E, the cooling fluid 140 flows adjacent to the sides of the embedded semiconductor devices 118 and then into the fluid outlet reservoir 127. While flowing in the fluid inlet reservoir 125, the cooling channels 119A, 119B and the fluid outlet reservoir 127, the cooling fluid will receive heat generated by the semiconductor devices 118 by thermal transfer from the thermally conductive dielectric polymer composite material. The heated cooling fluid flows from the fluid outlet reservoir 127 into the fluid outlet channels 121. The fluid outlet channels 121 may be coupled to a cooling fluid removal line via associated fluid coupling devices (not shown). The heated cooling fluid may then be recycled back to the cooling fluid reservoir for re-cooling and recycling back into the fluid inlet manifold 112.

To further enhance convective heat transfer to the cooling fluid, the inner walls of the fluid inlet channels 111, cooling channels 119A, 119B, and/or fluid outlet channels 121 (referred collectively as "channels") may have optimized cross-sectional topologies. The topologies define a geometry within the channels by or through which the cooling fluid flows. FIGS. 2A-2G illustrate several exemplary cross-section topologies that may be utilized. It should be understood that the embodiments described herein are not limited to those embodiments illustrated in 2A-2G and that many different topologies may be used. The optimized cross section topologies of the channels may provide for an increased surface area by which the cooling fluid may flow. The increased surface area may lead to an increase in the convective heat transfer to the cooling fluid, thereby removing more heat flux from the semiconductor devices 118. The topology utilized for the cooling channels may depend on parameters such as flow resistance and the desired maximum operating temperature, for example. Further, different channels (e.g., the fluid inlet channels, cooling channels, and fluid outlet channels) may comprise different cross sectional topologies depending on the particular application. The features of the optimized topologies may be formed during the molding process, for example, or may be separate inserts that are inserted into the channels after the molding process. The inserts may be fabricated separate from the molding process that forms the fluid inlet reservoir 112, the case body 116 and the fluid outlet reservoir 120. The inserts may then be positioned within the channels.

Figure 2A:
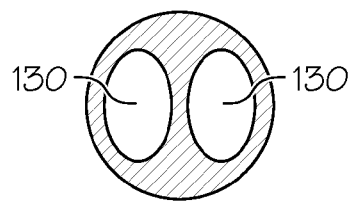
FIGS. 2A-2G depict cross-sectional views of channel topologies according to one or more embodiments shown and described herein.
Figure 2B:
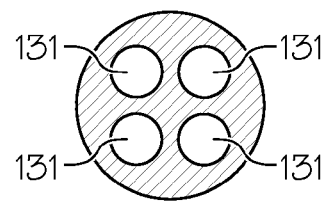
Figure 2C:
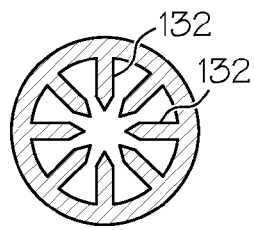
Figure 2D:
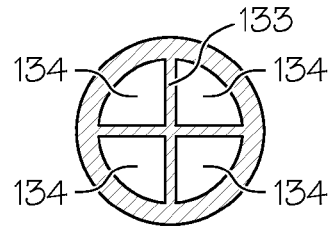
Figure 2E:
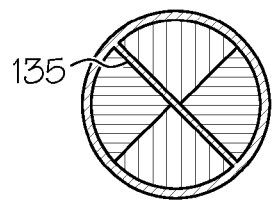
Figure 2F:
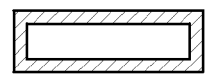
Figure 2G:

FIG. 2A illustrates a cross-section of a circular-shaped channel having two lobed openings 130 through which cooling fluid may flow. FIG. 2B illustrates a cross-section of a circular-shaped channel having four circular openings 131 through which cooling fluid may flow. The smaller circular openings 131 provide for increased surface area and convective heat transfer. FIG. 2C illustrates a circular channel embodiment having a plurality of radially extending protrusions 132. Cooling fluid flowing through the channel may be forced to flow by each of the radially extending protrusions 132, thereby increasing the surface area of the channel. FIG. 2D is an illustration of a cross-section of a channel having a cross-cut feature 133 positioned therein. Cooling fluid may flow in quadrant openings 134 defined by the cross-cut feature 133. FIG. 2E illustrates a cross-sectional view of a channel having a spiral insert 135 positioned therein. Cooling fluid may flow within the channel of FIG. 2E in a spiral pattern to introduce fluid mixing within the cooling fluid. In other embodiments, the channels may not include optimized topologies but rather optimized shapes (and sizes) to achieve a desired flow rate. For example, FIG. 2F illustrates a rectangular, open channel while FIG. 2G illustrates an oval, open channel. As stated above, various channels within the cooling device 110 may comprise different topologies to provide optimal thermal transfer. The topologies, shapes and sizes may be determined by computations, simulations, optimization, and experimentation.

Figure 3:
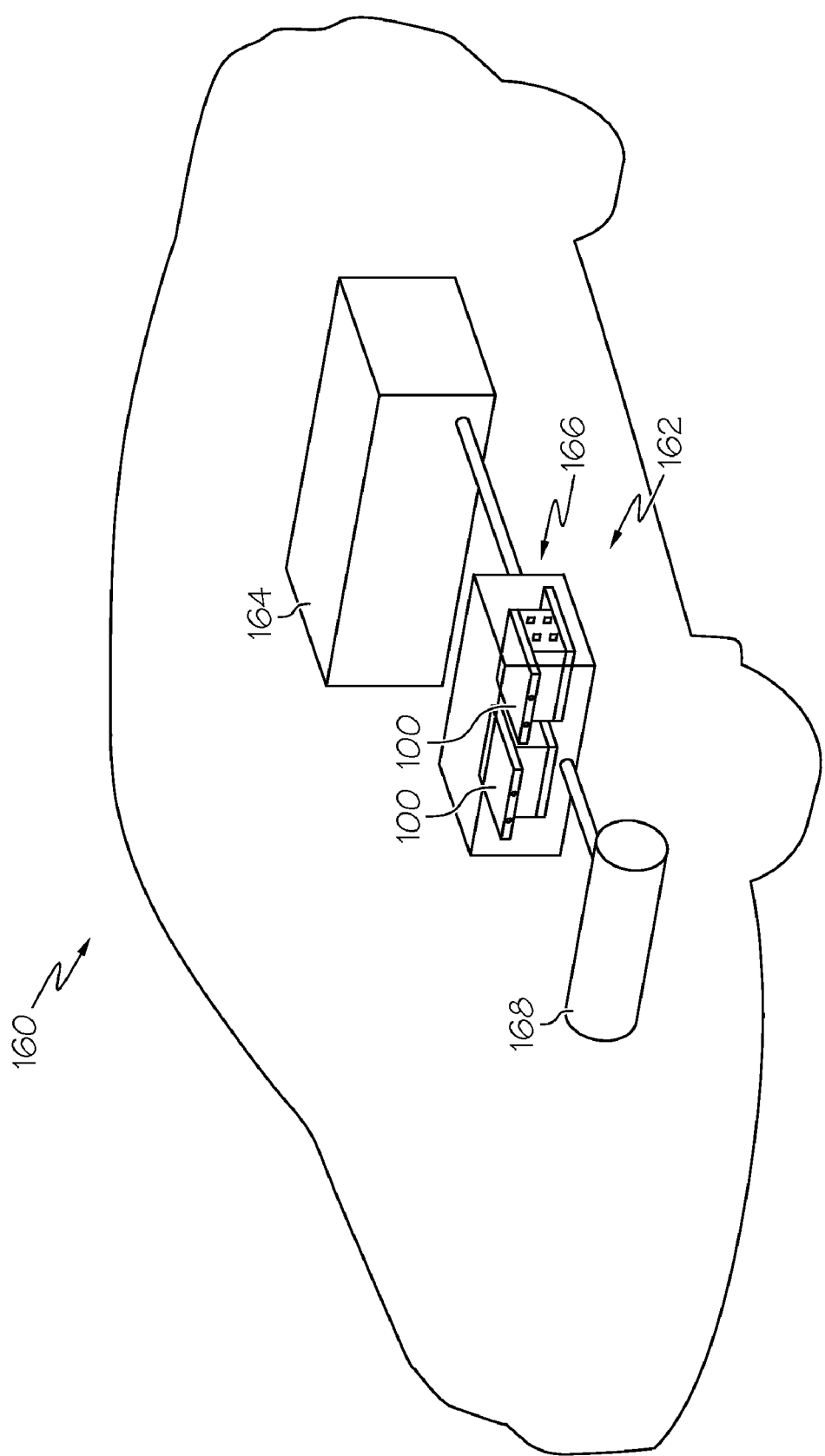
FIG. 3 depicts a vehicle comprising power modules electrically coupled to a vehicle electrical system according to one or more embodiments shown and described herein.

The cooling devices and power modules described herein may be incorporated into an electrical system of a vehicle. For example, hybrid fuel-electric vehicles or electric vehicles (e.g., cars, busses, trains, etc.) may comprise a vehicle electrical system that includes one or more power modules configured as an inverter/converter that converts direct current into alternating current to electrically couple a battery source to an electric motor. FIG. 3 illustrates a vehicle 160 having a vehicle electrical system 162. The vehicle electrical system 162 is defined by a battery device 164 that is electrically coupled to an inverter/converter module 166. The inverter/converter module 166 is electrically coupled to a motor 168. The power module 100 and semiconductor devices embedded therein are incorporated within the inverter/converter module 166 and may be electrically coupled to the vehicle electrical system 162 via the electrical contacts as well as associated wiring. The cooling devices described herein may be utilized to remove heat flux generated by the power modules operating in the vehicle electrical system 162.

It should now be understood that the power modules and cooling devices described herein may be utilized to remove heat generated by a heat generating device, such as a semiconductor device, by convective heat transfer. Cooling devices may be made of a molded thermally conductive polymer composite material having thermally conductive particulate filler material therein. The cooling devices may have a plurality of channels through which cooling fluid may circulate. Heat produced by the heat generating device may be removed from the power module by convective transfer through the thermally conductive polymer composite material as well as through the cooling fluid circulating through the plurality of channels. Additionally, the channels may have optimized cross-sectional topologies to provide increased surface area over which the cooling fluid may flow.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling device comprising:
   a fluid inlet manifold formed of a molded polymer composite material and comprising a fluid inlet channel fluidly coupled to a fluid inlet reservoir;
   a case body formed of the molded polymer composite material and comprising a plurality of cooling channels extending from a first surface of the case body to a second surface of the case body, wherein the cooling channels fluidly couple the first surface of the case body to the fluid inlet reservoir of the fluid inlet manifold; and
   a fluid outlet manifold formed of the molded polymer composite material and comprising a fluid outlet channel fluidly coupled to a fluid outlet reservoir, wherein the fluid outlet reservoir is fluidly coupled to the plurality of cooling channels at the second surface of the case body, and each of the cooling channels, the fluid inlet channel and the fluid outlet channel comprises:
      a cross-sectional topology comprising a plurality of radially extending protrusions; or
      a cross-sectional topology comprising a plurality of openings; or
      one or more spiral inserts disposed therein.

2. The cooling device as claimed in claim 1 wherein the molded polymer composite material comprises a thermally conductive particulate filler material embedded in a polymer matrix.

3. The cooling device as claimed in claim 1 wherein the molded polymer composite material comprises one or more of the following: a thermally conductive liquid crystalline polymer material, a thermally conductive polyphenylene sulfide material, and a thermally conductive polypropylene material.

4. A power module comprising:
   a fluid inlet manifold comprising a fluid inlet channel fluidly coupled to a fluid inlet reservoir;
   a case body comprising a plurality of cooling channels extending from a first surface of the case body to a second surface of the case body, and a semiconductor device comprising a first side, a second side, a third side and a fourth side, wherein the semiconductor device is embedded within the case body and the cooling channels fluidly couple the first surface of the case body to the fluid inlet reservoir of the fluid inlet manifold; and
   a fluid outlet manifold comprising a fluid outlet channel fluidly coupled to a fluid outlet reservoir, wherein:
   the fluid outlet reservoir is fluidly coupled to the plurality of cooling channels at the second surface of the case body;
   the fluid inlet channel, the fluid inlet reservoir, the cooling channels, the fluid outlet reservoir and the fluid outlet channel enable a flow of a cooling fluid adjacent to the first, second, third and fourth sides of the semiconductor device and
   each of the cooling channels, the fluid inlet channel and the fluid outlet channel comprises:
      a cross-sectional topology comprising a plurality of radially extending protrusions; or
      a cross-sectional topology comprising a plurality of openings; or
      one or more spiral inserts disposed therein.

5. The power module as claimed in claim 4 wherein the case body is molded around the semiconductor device.

6. The power module as claimed in claim 4 wherein the fluid inlet manifold, the case body and the fluid outlet manifold are formed of a molded polymer composite material.

7. The power module as claimed in claim 6 wherein the molded polymer composite material comprises a thermally conductive particulate filler material embedded in a polymer matrix.

8. The power module as claimed in claim 6 wherein the molded polymer composite material comprises one or more of the following: a thermally conductive liquid crystalline polymer material, a thermally conductive polyphenylene sulfide material, and a thermally conductive polypropylene material.

9. The power module as claimed in claim 6 wherein the fluid inlet channel, the cooling channels and the fluid outlet channel comprise a cross-section topology that provides a convective heat transfer between the molded polymer composite material and the cooling fluid that is greater than a convective heat transfer provided by a cooling channel having a flat wall topology.

10. A vehicle comprising a power module electrically coupled to a vehicle electrical system, the power module comprising:
- a fluid inlet manifold formed of a molded polymer composite material and comprising a fluid inlet channel fluidly coupled to a fluid inlet reservoir;
- a case body formed of the molded polymer composite material and comprising a plurality of cooling channels extending from a first surface of the case body to a second surface of the case body, and a semiconductor device comprising one or more electrical contacts, a first side, a second side, a third side and a fourth side, wherein the semiconductor device is embedded in the case body, the one or more electrical contacts of the semiconductor device are electrically coupled to the vehicle electrical system, and the cooling channels fluidly couple the first surface of the case body to the fluid inlet reservoir of the fluid inlet manifold; and
- a fluid outlet manifold formed of the molded polymer composite material and comprising a fluid outlet channel fluidly coupled to a fluid outlet reservoir, wherein:
    - the fluid outlet reservoir is fluidly coupled to the plurality of cooling channels at the second surface of the case body;
    - the fluid inlet channel, the fluid inlet reservoir, the cooling channels, the fluid outlet reservoir and the fluid outlet channel enable a flow of a cooling fluid adjacent the first, second, third and fourth sides of the semiconductor device and
    - each of the cooling channels, the fluid inlet channel and the fluid outlet channel comprises:
        - a cross-sectional topology comprising a plurality of radially extending protrusions; or
        - a cross-sectional topology comprising a plurality of openings; or
        - one or more spiral inserts disposed therein.

11. The vehicle as claimed in claim 10 wherein the molded polymer composite material comprises a thermally conductive particulate filler material embedded in a polymer matrix.

12. The vehicle as claimed in claim 10 wherein the molded polymer composite material comprises one or more of the following: a thermally conductive liquid crystalline polymer material, a thermally conductive polyphenylene sulfide material, and a thermally conductive polypropylene material.

13. The vehicle as claimed in claim 10 wherein the fluid inlet channel, the cooling channels and the fluid outlet channel comprise a cross-section topology that provides a convective heat transfer between the molded polymer composite material and the cooling fluid than a cooling channel having a flat wall topology.

* * * * *